(12) United States Patent
Woo et al.

(10) Patent No.: US 10,882,298 B2
(45) Date of Patent: Jan. 5, 2021

(54) SYSTEM FOR ADJUSTING RELATIVE POSITIONS BETWEEN COMPONENTS OF A BONDING APPARATUS

(71) Applicant: ASM Technology Singapore Pte Ltd, Singapore (SG)

(72) Inventors: Shui Cheung Woo, Kwai Chung (HK); Liang Hong Tang, Kwai Chung (HK); Wan Yin Yau, Kwai Chung (HK); Wai Yuen Cheung, Kwai Chung (HK); Kui Kam Lam, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 116 days.

(21) Appl. No.: 15/344,947

(22) Filed: Nov. 7, 2016

(65) Prior Publication Data

US 2018/0126718 A1    May 10, 2018

(51) Int. Cl.
  *B32B 38/18*  (2006.01)
  *H01L 23/00*  (2006.01)
  (Continued)

(52) U.S. Cl.
  CPC .............. *B32B 38/18* (2013.01); *B32B 37/06* (2013.01); *B32B 41/00* (2013.01); *H01L 24/75* (2013.01);
  (Continued)

(58) Field of Classification Search
  CPC ......... B32B 37/06; B32B 38/18; B32B 41/00; B32B 2457/00; H01L 21/44; H01L 21/68;
  (Continued)

(56) References Cited

U.S. PATENT DOCUMENTS

| 6,449,516 B1 * | 9/2002 | Kyomasu | B23K 20/004 700/58 |
| 2007/0145102 A1 * | 6/2007 | Blessing | H05K 13/0812 228/101 |
| 2012/0279660 A1 | 11/2012 | Chan et al. | 156/378 |

FOREIGN PATENT DOCUMENTS

| JP | 2004-31412 | 1/2004 |
| KR | 10-2016-0118925 A | 10/2016 |

(Continued)

OTHER PUBLICATIONS

Taiwan Office Action, dated Mar. 28, 2018, issued in corresponding Taiwan Patent Application No. 106136012. Total 10 pages.

(Continued)

*Primary Examiner* — George R Koch
(74) *Attorney, Agent, or Firm* — Ostrolenk Faber LLP

(57) ABSTRACT

A bonding apparatus comprises a movable bond head collet, a reference marker configured to move with the bond head collet, a flip head collet, first and second imaging devices and an adjusting mechanism. In use, the first imaging device captures one or more images of the reference marker and the flip head collet, and the second imaging device captures one or more images of the reference marker and the bond head collet. The adjusting mechanism aligns a position of the bond head collet with a position of the flip head collet based on an offset that is determined from the images of the flip head collet, bond head collet and reference marker. The flip head collet retrieves an electrical component and transfers the electrical component to the bond head collet at the alignment position.

15 Claims, 7 Drawing Sheets

(51) Int. Cl.
  *B32B 37/06* (2006.01)
  *B32B 41/00* (2006.01)
(52) U.S. Cl.
  CPC ... *B32B 2457/00* (2013.01); *H01L 2224/7565* (2013.01); *H01L 2224/75702* (2013.01); *H01L 2224/75753* (2013.01); *H01L 2224/75901* (2013.01)
(58) Field of Classification Search
  CPC ......... H01L 21/684; H01L 2224/75001; H01L 2224/76001; H01L 2224/77001; H01L 2224/78001; H01L 2224/79001
  See application file for complete search history.

(56) References Cited

FOREIGN PATENT DOCUMENTS

TW    1329885         9/2010
WO    WO 2015/170645 A1    11/2015

OTHER PUBLICATIONS

Formality Examination Report dated Mar. 28, 2018 issued in corresponding Philippine Patent Application No. 1/2017/000309.
Korean Office Action, dated Aug. 9, 2019, issued in corresponding Korean Patent Application No. 10-2017-0144504, included English translation. Total 14 pages.

\* cited by examiner

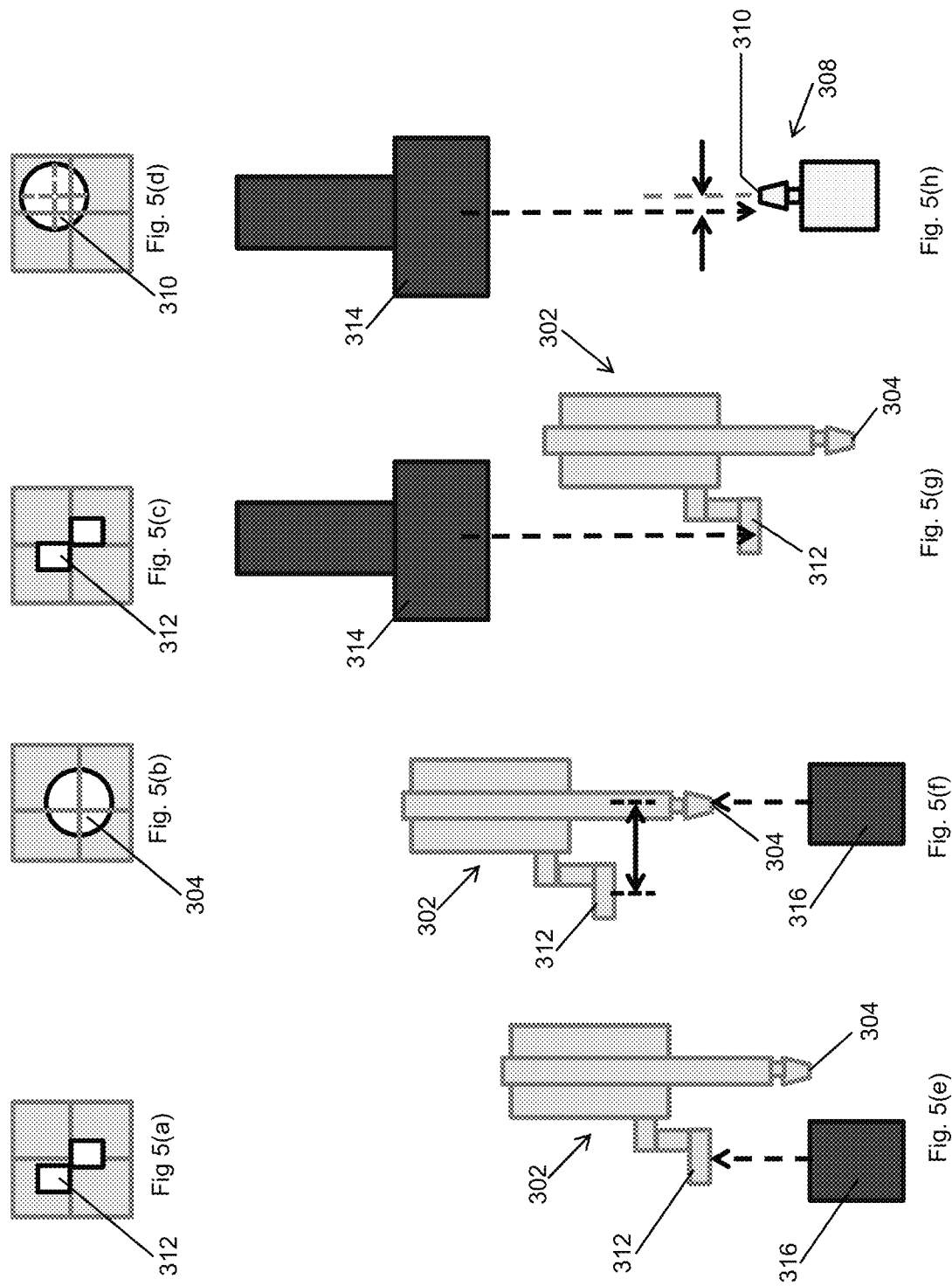

SYSTEM FOR ADJUSTING RELATIVE POSITIONS BETWEEN COMPONENTS OF A BONDING APPARATUS

FIELD OF THE INVENTION

The present invention relates to a system for adjusting relative positions between different components of a bonding apparatus and a bonding apparatus incorporating such a system.

BACKGROUND OF THE INVENTION

FIG. 1 shows a prior art bonding apparatus 100. The bonding apparatus 100 has a bond head 102 with a bond head collet 104 and a flip head 106 with a flip head collet 108. In use, the flip head collet 108 picks up a die 110 from a wafer 112 and is flipped 180°. The bond head collet 104 then picks up the die 110 from the flip head collet 108. It is important to ensure the stability of the handover of the die 110 from the flip head collet 108 to the bond head collet 104 by ensuring that the bond head collet 104 and the flip head collet 108 are aligned during the handover. This is because such handover stability has a direct impact on both the quality of flux dipping for die bonding and the bonding quality.

The position at which the die 110 is picked up by the bond head collet 104 may be referred to as the handover position having Cartesian coordinates X, Y. In the apparatus 100, the handover position is dependent on the position of the bond head collet 104 and is adjustable by moving the bond head 102. A height of the handover position is also fixed and learnt by the bonding apparatus 100. The X and Y components of the handover position are conventionally determined using a combination of manual and automatic adjustment. In particular, a user visually estimates the offset between the center of the bond head collet 104 and the center of the flip head collet 108, and manually adjusts the X, Y position of the bond head collet 104 to align these centers.

FIG. 2 is an illustration of the center of the die 110 relative to the center of the bond head collet 104. To verify the accuracy of the aforesaid manual adjustment, the center of the bond head collet 104 is first adjusted to an optical center of an uplook camera. A die 110 is then picked up by the flip head collet 108 and handed over to the bond head collet 104, which is then moved to the position aligned with the optical center of the uplook camera. The position of the die 110 relative to the optical center of the uplook camera is then determined, the center of the die 110 being offset from the center of the bond head collet 104 by an offset amount 202 equal to its offset from the optical center of the uplook camera. Ideally, this amount 202 should be zero. In the bonding apparatus 100, if the offset amount 202 is not sufficiently close to zero, the bond head 102 needs to be further adjusted manually until the offset amount 202 is zero. The accuracy of this compensation is again verified and this process of adjusting the bond head 102 and verifying the accuracy of the compensation is repeated until the offset amount 202 is acceptably close to zero. The final adjusted position of the bond head collet 104 is then used for the subsequent transfers of the dies 110 from the flip head collet 108 to the bond head collet 104.

As described above, the setup of the bonding apparatus 100 is tedious as it requires the user to perform visual estimation of the offset and manual adjustment of the bond head 102. Further, the setup time of the apparatus 100 is long since the setup requires repeated trial and error to achieve a satisfactory result.

It is crucial that the bond head collet 104 does not pick up a die 110 at a position away from the center of the collet 104 (which may be referred to as a picking error). Picking errors may result in machine errors. For example, the bond head collet 104 may not successfully pick up the die 110, causing a handover failure. There is also a chance that the position of the die 110 does not completely cover the suction hole on the bond head collet 104. This causes air leakage, which leads to a poor suction force on the die 110, and in turn increases the risk of dropping the die 110. A picking error may also cause the die 110 to be rotated, leading to a large uplook angle being required to inspect the die 110. Due to the above reasons, whenever there are picking errors, the bonding quality of the output tends to be poor and postbond errors may occur, thus affecting the throughput of the apparatus 100. Moreover, if the misalignment between the die 110 and the center of the bond head collet 104 causes the suction hole of the collet 104 to be partially exposed, there is a risk of flux suck-in during the flux-dipping process and this can contaminate the bond head collet 104.

SUMMARY OF THE INVENTION

The present invention aims to provide a new and useful system for adjusting relative positions between components of a bonding apparatus.

In general terms, the present invention proposes a bonding apparatus having a movable bond head collet, a flip head collet and a reference marker that moves with the bond head collet, wherein the reference marker is used to align a position of the bond head collet with a position of the flip head collet.

Specifically, a first aspect of the present invention is a bonding apparatus comprising: a movable bond head collet; a reference marker configured to move with the bond head collet; a flip head collet configured to retrieve an electrical component and to transfer the electrical component to the bond head collet; a first imaging device configured to capture one or more images of the reference marker and the flip head collet; a second imaging device configured to capture one or more images of the reference marker and the bond head collet; and an adjusting mechanism operative to align a position of the bond head collet with a position of the flip head collet based on an offset that is determined from the images of the flip head collet, bond head collet and reference marker.

The adjustment of the handover position in the above bonding apparatus can be conducted by optical calibration instead of manually. This increases the ease at which the adjustment is performed. Since the handover position is usually adjusted not only during the setup of the bonding apparatus but also each time after the collets are changed, the amount of effort on the user's part can be greatly reduced. Furthermore, as compared to bonding apparatuses using manual adjustment (which often leads to variations in the handover position when the handover position is adjusted by different users), the handover position in the above bonding apparatus can be adjusted with greater accuracy and precision. This allows the bonding apparatus to handle small die packages more securely. Moreover, the setup time and the time required to re-adjust the handover position when the collets are changed can be reduced since the handover position obtained via the optical calibration is sufficiently accurate, and hence, no further adjustment based on trial and error is required.

The first and second imaging devices may be directed in opposite directions. By using such imaging devices, the captured images can include the portions of the collets configured to hold the electrical components (since these portions are also opposite facing). This can increase the accuracy of the handover position determined using the captured images.

The apparatus according to claim 1, wherein the reference marker is movable between a position where it is viewable by the first imaging device and another position where it is viewable by the second imaging device.

The first imaging device may be located at a relatively fixed position over the flip head collet. This reduces the number of movable parts in the bonding apparatus, in turn facilitating the maintenance of the bonding apparatus. The reference marker may be movable between a position where it is viewable by the first imaging device and another position where it is viewable by the second imaging device.

The reference marker may be located on a transparent body. This allows the reference marker to be seen from both the upper side and the underside of the transparent body. This not only increases the ease of manufacturing the bonding apparatus, but also increases the accuracy of the handover position determined using the reference marker. For example, the transparent body may comprise glass.

The offset may be determined using a distance between the bond head collet and the reference marker as obtained from the one or more images of the bond head collet and the reference marker captured by the second imaging device; and positions of the reference marker and the flip head collet relative to the first imaging device as obtained from the one or more images of the reference marker and the flip head collet captured by the first imaging device. Using the reference marker as a common reference between the two imaging devices allows the handover position to be determined with greater ease and accuracy.

A second aspect of the present invention is a method for aligning a position of a movable bond head collet with a position of a flip head collet configured to retrieve an electrical component and to transfer the electrical component to the bond head collet, the method comprising the steps of: capturing one or more images of the flip head collet and a reference marker configured to move with the bond head collet using a first imaging device; capturing one or more images of the bond head collet and the reference marker using a second imaging device; determining an offset between the flip head collet and the bond head collet using the images of the flip head collet, bond head collet and reference marker; and adjusting the bond head collet relative to the flip head collet to align the positions of the bond head collet and the flip head collet based on the determined offset.

A third aspect of the present invention is a bonding apparatus comprising: a movable bond head collet; a reference marker configured to move with the bond head collet; a first imaging device configured to capture one or more images of the reference marker and a bonding position at which the bond head collet is operative to bond an electrical component; a second imaging device configured to capture one or more images of the reference marker and the bond head collet; and an adjusting mechanism operative to align a position of the bond head collet with a position of the bonding position based on an offset that is determined from the images of the bonding position, bond head collet and reference marker.

BRIEF DESCRIPTION OF THE FIGURES

An embodiment of the invention will now be illustrated for the sake of example only with reference to the following drawings, in which:

FIGS. 5(a) to 5(h) show schematic representations of the steps of the method of FIG. 4;

DETAILED DESCRIPTION OF THE EMBODIMENTS

Figure 1:
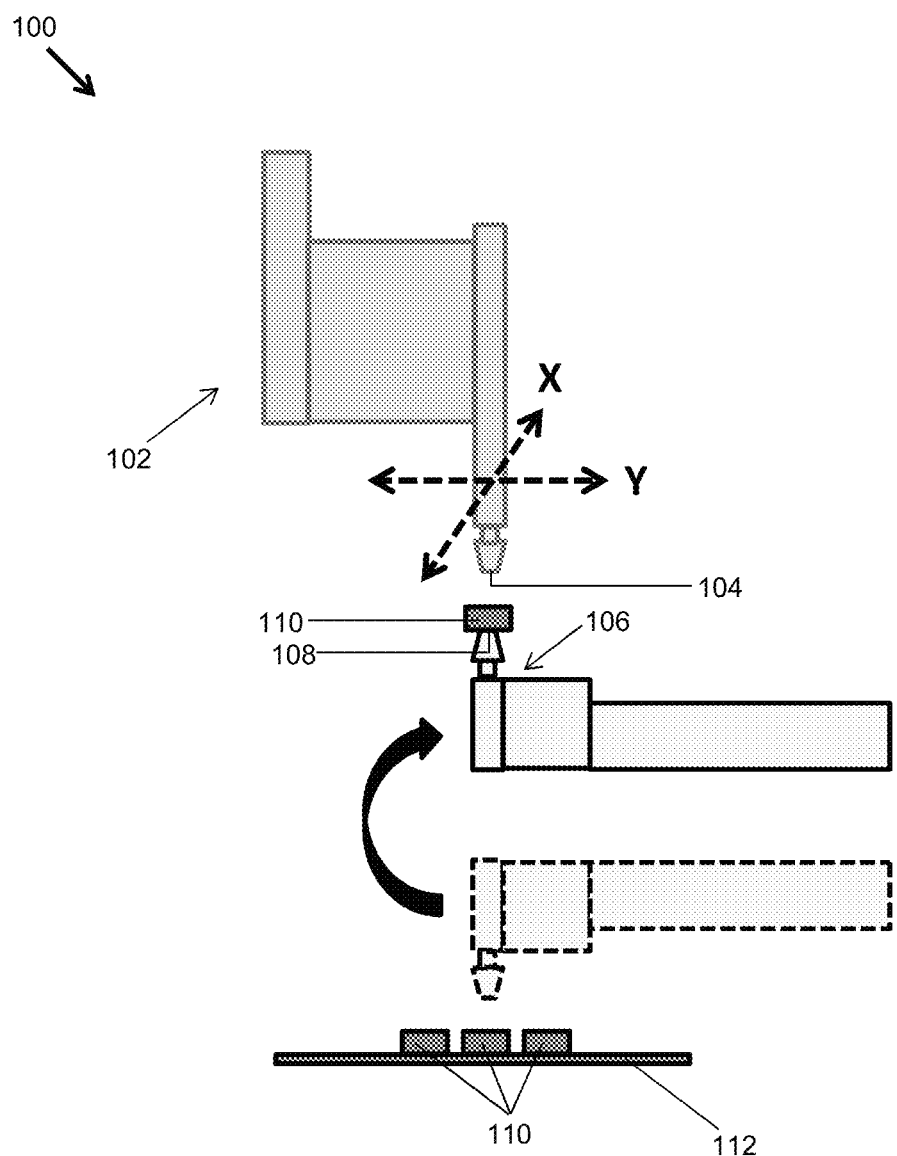
FIG. 1 shows a schematic representation of a prior art bonding apparatus.
Figure 2:
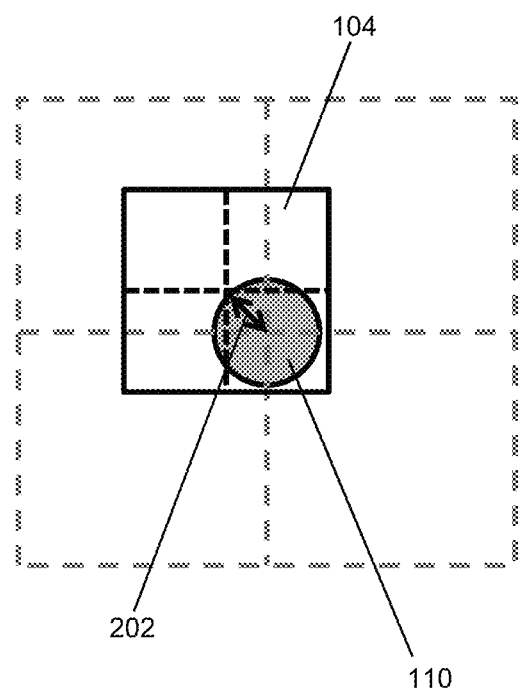
FIG. 2 is an illustration of a die relative to a bond head collet of the prior art bonding apparatus of FIG. 1.
Figure 3:
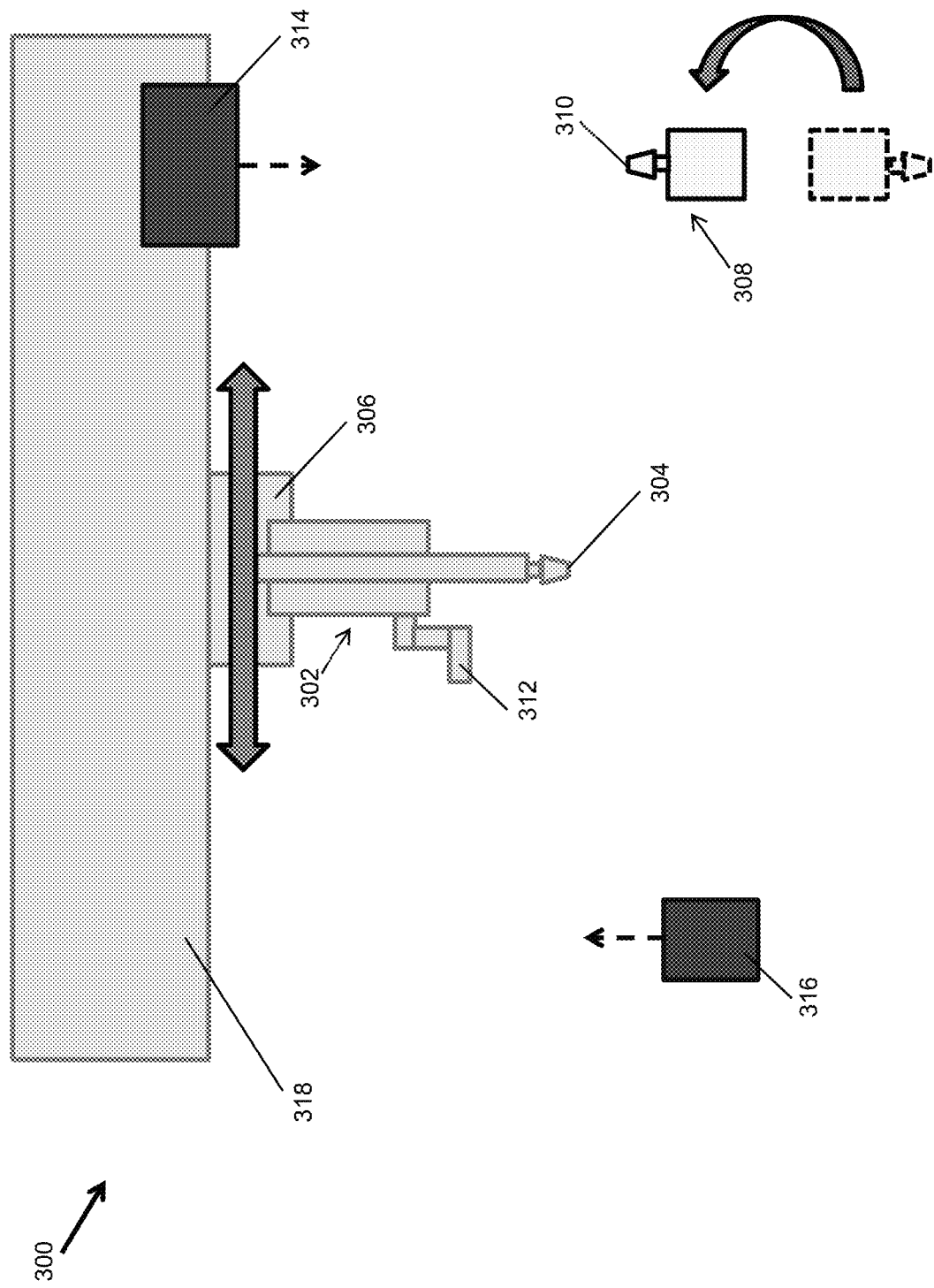
FIG. 3 shows a schematic representation of a bonding apparatus according to a preferred embodiment of the present invention.

FIG. 3 shows a schematic representation of a bonding apparatus 300 according to a preferred embodiment of the present invention.

The bonding apparatus 300 comprises a bond head 302 with a bond head collet 304, and a flip head 308 with a flip head collet 310. The bond head 302 is connected to an adjusting mechanism in the form of an encoder 306 which is in turn connected to a rail 318. The encoder 306 (and thus, the bond head 302) is movable along the length of the rail 318. The flip head 308 is fixed in position and is configured to retrieve an electrical component from a holding element (e.g. a die from a wafer) and invert 180° from a first orientation to a second orientation. In the first orientation, the flip head collet 310 is facing the holding element (downwards away from the rail 318) so as to retrieve the electrical component, whereas in the second orientation, the flip head collet 310 is facing upwards towards the rail 318 so as to transfer the electrical component to the bond head collet 304.

A transparent body in the form of a calibration glass 312 is connected to the bond head 302. A reference marker is located on the calibration glass 312 to mark the center of the calibration glass 312. As shown in FIG. 3, the calibration glass 312 (and hence, the reference marker) is located at a distance away from the bond head collet 304. The initial distance (D) between the reference marker and the bond head collet 304 is pre-known but the actual distance between them during use of the bonding apparatus 300 may deviate from this initial distance. Since the calibration glass 312 is connected to the bond head 302, the calibration glass 312 together with the reference marker moves with the bond head 302 whenever the bond head 302 is moved. The transparency of the calibration glass 312 allows the reference marker to be visible from both the upper side and the underside of the calibration glass 312.

The bonding apparatus 300 further includes a vision system having an imaging mechanism and a processor. The imaging mechanism includes a first imaging device in the form of a flip head alignment optic 314 and a second imaging device in the form of an uplook camera 316. The flip head alignment optic 314 and the uplook camera 316 are directed in opposite directions. In particular, the uplook camera 316 is directed upwards towards the rail 318, whereas the flip head alignment optic 314 is directed downwards towards the flip head collet 310.

Figure 4:
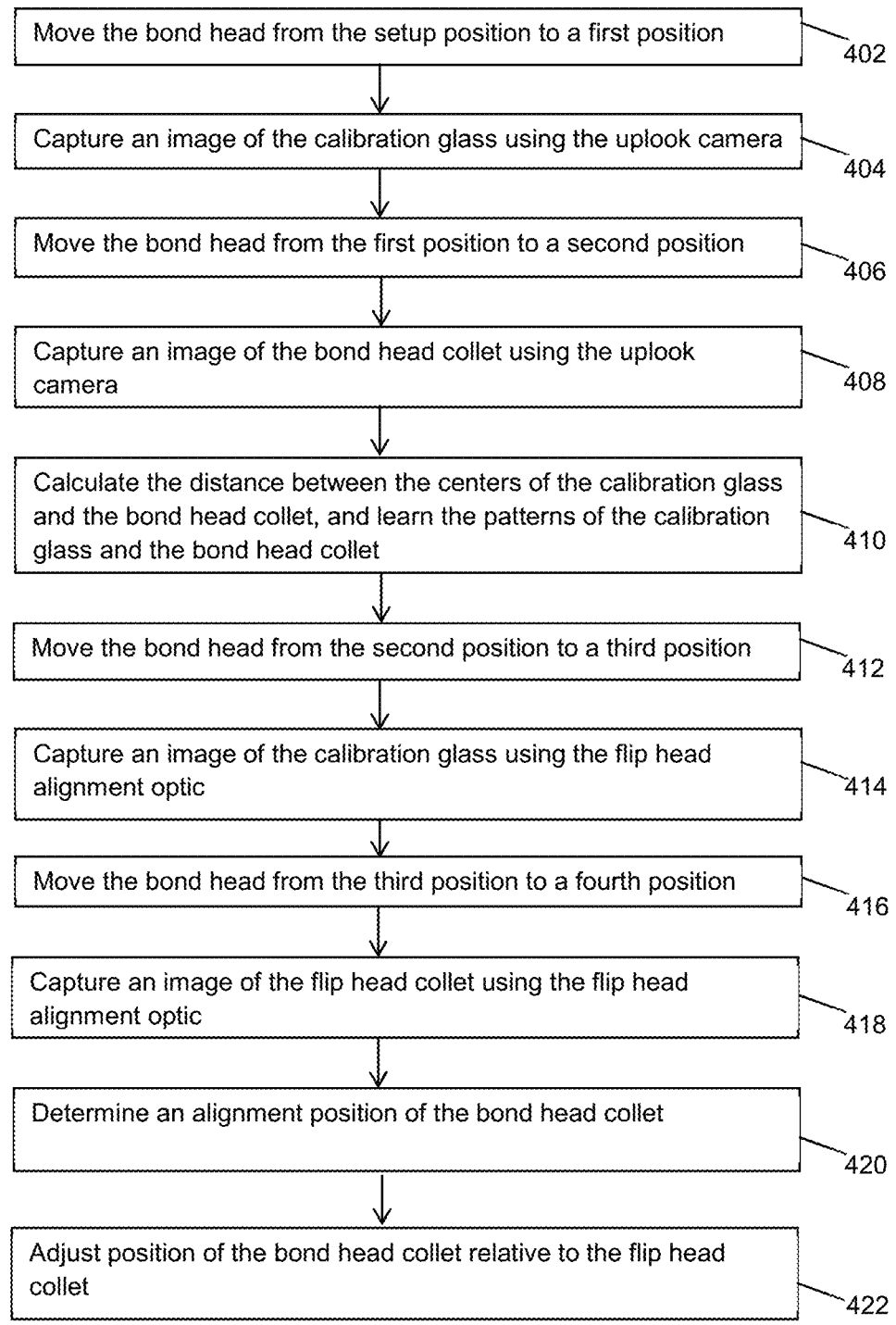
FIG. 4 shows a flow diagram illustrating a method for adjusting a position of a bond head collet relative to a flip head collet of the bonding apparatus of FIG. 3.

In use, the bonding apparatus 300 is set up with the bond head 302 at a setup position and with the flip head 308 in the second orientation. The bonding apparatus 300 performs a method 400 for adjusting a position of the bond head collet 304 relative to the flip head collet 310, the steps of which are set out in FIG. 4. The method 400 comprises steps 402-422 which will be elaborated upon below.

In step 402, the bond head 302 is moved from the setup position to a first position where the calibration glass is above the uplook camera 316.

In step 404, an image of the calibration glass 312 (together with the reference marker) is captured using the uplook camera 316.

In step 406, the bond head 302 is moved from the first position to a second position where the bond head collet 304 is above the uplook camera 316. The distance between the first and second positions is equal to the pre-known initial distance (D) between the bond head collet 304 and the reference marker.

In step 408, an image of the bond head collet 304 is captured using the uplook camera 316.

In step 410, the distance between the center of the calibration glass 312 (where the reference marker is located) and the center of the bond head collet 304 is calculated using the captured images from steps 404 and 408. Specifically, an offset between the reference marker and the center of the uplook camera 316 (O1) when the image of the calibration glass 312 was captured, and an offset between the center of the bond head collet 304 and the center of the uplook camera 316 (O2) when the image of the bond head collet 304 was captured are determined using respectively the image of the calibration glass 312 and the image of the bond head collet 304. Then, using these offsets (O1, O2) and the pre-known distance (D) between the first and second positions, the distance between the center of the calibration glass 312 and the center of the bond head collet 304 is obtained or learnt by consolidating the various offsets. The patterns of the calibration glass 312 and the bond head collet 304 as viewed by the uplook camera 316 are also learnt using the captured images.

In step 412, the bond head 302 is moved from the second position to a third position where the calibration glass 312 is below the flip head alignment optic 314.

In step 414, an image of the calibration glass 312 (together with the reference marker) is captured using the flip head alignment optic 314.

In step 416, the bond head 302 is moved from the third position to a fourth position away from the flip head alignment optic 314 so that the flip head collet 310 is viewable by the flip heat alignment optic 314.

In step 418, an image of the flip head collet 310 is captured using the flip head alignment optic 314.

In step 420, positions of the reference marker and the flip head collet 310 relative to the flip head alignment optic 314 when the images of the reference marker and the flip head collet 310 are captured are determined. Specifically, an offset between the reference marker and the center of the flip head alignment optic 314 (O3) when the bond head 302 was at the third position, and an offset between the center of the flip head collet 310 and the center of the flip head alignment optic 314 (O4) are determined using respectively the image of the calibration glass 312 and the image of the flip head collet 310. Then, using these offsets (O3, O4) and the distance (D±d) between the center of the calibration glass 312 and the bond head collet 304, an alignment position between the center of the flip head collet 310 and the center of the bond head collet 304 is determined. In particular, the alignment position is determined from the offset from the position of the reference marker when the reference marker is aligned with the center of the flip head alignment optic 314. The patterns of the calibration glass 312 and the flip head collet 310 as viewed by the flip head alignment optic 314 are also learnt using the captured images.

In step 422, the relative position between the flip head collet 310 and the bond head collet 304 is adjusted based on the alignment position determined in step 420. In particular, the flip head 308 is inverted from the second orientation to the first orientation to retrieve an electrical component from a holding element (e.g. a die from a wafer), and is then inverted back to the second orientation. The bond head 302 is then moved to the alignment position at which the center of the bond head collet 304 is aligned with the center of the flip head collet 310. When the bond head 302 is at the alignment position, the electrical component is transferred from the flip head collet 310 to the bond head collet 304. The bond head 302 is then moved to a bonding station for a bonding process.

Step 422 is repeated on a predetermined number of electrical components. Thereafter, steps 402 to 420 are repeated to obtain another alignment position between the flip head collet 310 and the bond head collet 304 (which may or may not be the same as the previous alignment position) and using this alignment position, step 422 is performed on yet another predetermined number of electrical components.

FIGS. 5(a)-5(h) illustrate the steps of method 400. In particular, FIG. 5(e) shows step 404 in which an image of the calibration glass 312 is captured by the uplook camera 316, and FIG. 5(a) shows the pattern of the calibration glass 312 in this captured image. FIG. 5(f) shows step 408 in which an image of the bond head collet 304 is captured by the uplook camera 316, and FIG. 5(b) shows the pattern of the bond head collet 304 in this captured image. FIG. 5(g) shows step 414 in which an image of the calibration glass 312 is captured by the flip head alignment optic 314, and FIG. 5(c) shows the pattern of the calibration glass 312 in this captured image. FIG. 5(h) shows step 418 in which an image of the flip head collet 310 is captured by the flip head alignment optic 314, and FIG. 5(d) shows the pattern of the flip head collet 310 in this captured image. In FIGS. 5(a)-5(d), the patterns are superimposed on grids representing the respective centers of the imaging devices 314, 316 to show the offset of the calibration glass 312 or the collets 304, 310 from the center of the respective imaging device.

Figure 6C:
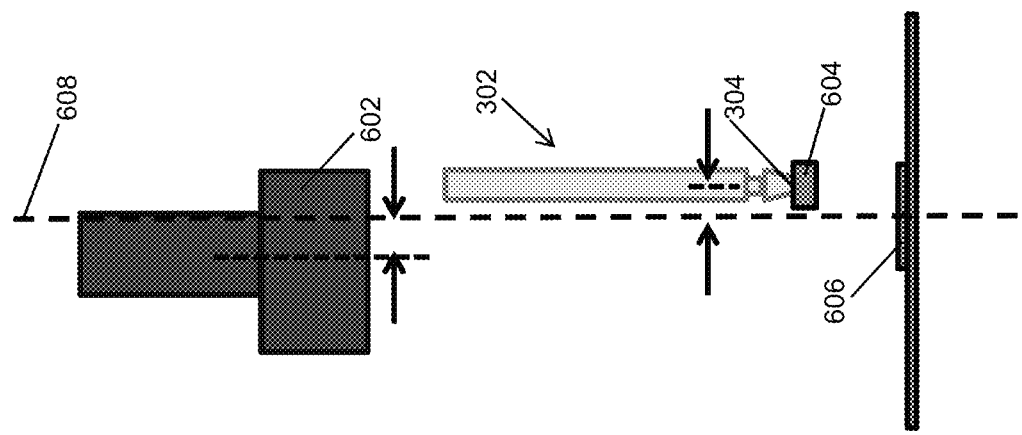
FIG. 6(a) shows a bonding station, and FIGS. 6(b) to 6(c) demonstrate thermal effect on the bonding apparatus of FIG. 3 at the bonding station.
Figure 6B:
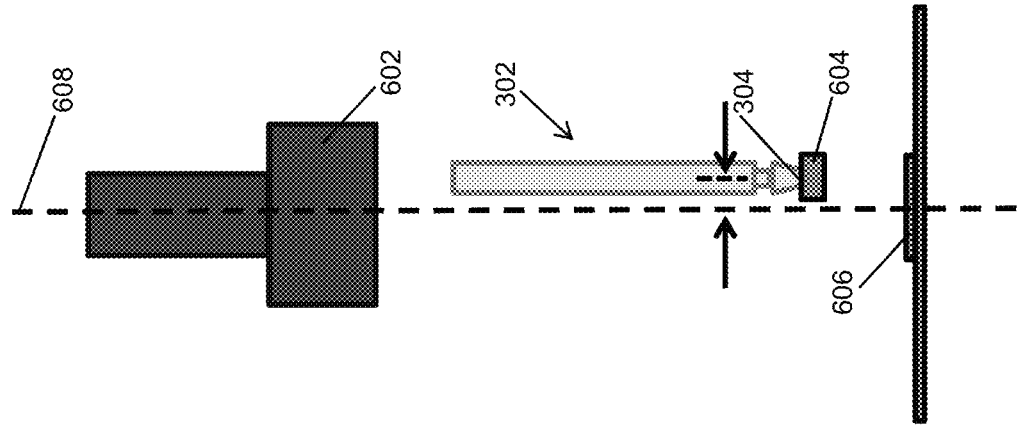
Figure 6A:
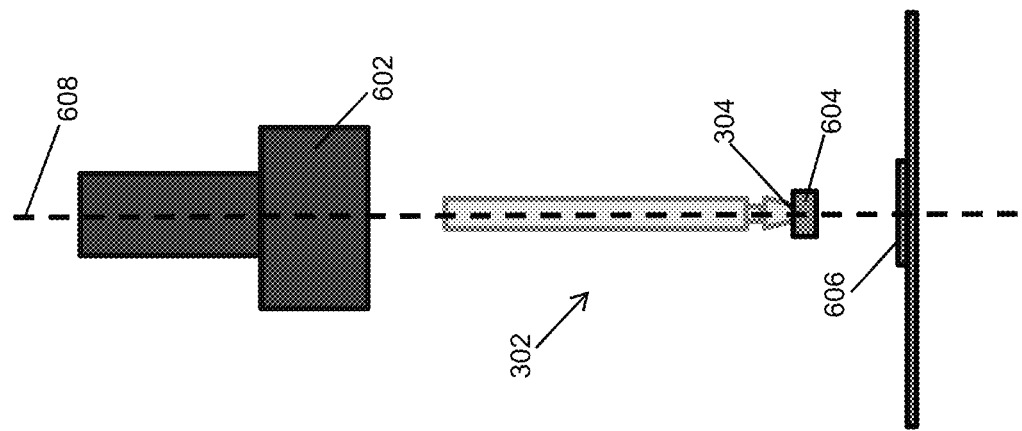
Figure 7:
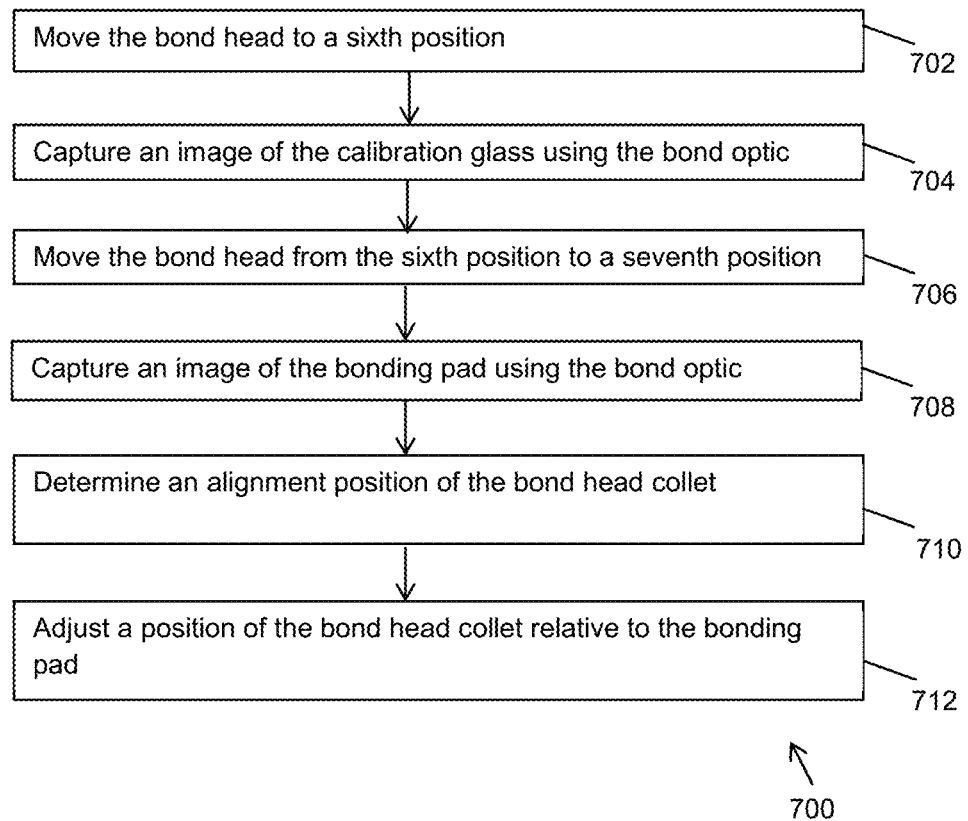
FIG. 7 shows a flow diagram illustrating a method for adjusting relative positions between the bond head collet of the bonding apparatus of FIG. 3 and a bonding pad.

As mentioned above, the bond head 302 is moved to a bonding station for a bonding process. FIG. 6(a) shows the bond head 302 at the bonding station which comprises a third imaging device in the form of a bond optic 602 and a bonding pad 606 having a bonding position at which the bond head collet 302 is operative to bond the electrical component 604. In FIG. 6(a), the centers of the bond optic 602, the bond head collet 304, the electrical component 604 and the bonding pad 606 are aligned along an alignment axis 608. FIGS. 6(b) and 6(c) illustrate thermal effect on bonding accuracy. Specifically, FIG. 6(b) shows how the center of the bond head collet 304 is shifted from the alignment axis 608 due to thermal expansion of the bond head 302. FIG. 6(c) shows how both the center of the bond optic 602 and the center of the bond head collet 304 are shifted from the alignment axis 608 due to thermal expansion of the bond optic 602 and the bond head 302. The position of the calibration glass 312 (not shown in FIGS. 6(a) to 6(c)) shifts together with the bond head collet 304 when thermal expansion of the bond head 302 occurs. The shifts in the positions of the bond head collet 304 and the bond optic 602 in FIGS. 6(b) and 6(c) cause the electrical component 604 to be erroneously bonded to the bonding pad 606 with the centers of the electrical component and the bonding position misaligned and this in turn leads to bonding errors.

To compensate for thermal effect, the bonding apparatus 300 may also perform a method 700 for aligning the position of the bond head collet 304 relative to the bonding position of the bonding pad 606. The method 700 comprises steps 702 to 712 which will be elaborated below.

In step 702, the bond head 302 is moved to a sixth position where the calibration glass 312 is below the bond optic 602.

In step 704, an image of the calibration glass 312 (together with the reference marker) is captured using the bond optic 602.

In step 706, the bond head 302 is moved from the sixth position to a seventh position away from the bond optic 602 so that the bonding pad 606 is viewable by the bond optic 302.

In step 708, an image of the bonding pad 606 is captured using the bond optic 602.

In step 710, positions of the reference marker and the bonding position relative to the bond optic 602 when the images of the reference marker and the bonding pad 606 are captured are determined. Specifically, an offset between the reference marker and the center of the bond optic 602 (O5) when the bond head 302 was at the sixth position, and an offset between the center of the bonding position and the center of the bond optic 602 (O6) are determined using respectively the image of the calibration glass 312 and the image of the bonding pad 606. Then, using these offsets (O5, O6) and the distance between the center of the calibration glass 312 and the bond head collet 304 (D±d as determined in step 410 of method 400), an alignment position between the centers of the bond head collet 304 and the bonding position is determined. In particular, the alignment position is determined by consolidating the various offsets.

In step 712, the position of the bond head collet 304 relative to the bonding pad 606 is adjusted based on the alignment position derived in step 710. In particular, the bond head 302 is moved to the alignment position at which the center of the bond head collet 304 is aligned with the center of the bonding position. When the bond head 302 is at the alignment position, the electrical component is transferred from the bond head collet 304 onto the bonding pad 606 and is then bonded to the bonding pad 606.

Similarly, step 712 is repeated on a predetermined number of electrical components, after which, steps 702 to 710 are repeated to obtain an updated alignment position between the bond head collet 304 and the bonding position (which may or may not be the same as the previous alignment position). Using this updated alignment position, step 712 is performed on yet another predetermined number of electrical components.

Various modifications will be apparent to those skilled in the art.

For example, instead of the flip head collet 310 and the bond head collet 304, method 400 as described above can be used on other components of the bonding apparatus 300 by modifying the method 400 accordingly.

Step 422 may include further sub-steps to compensate for picking errors. For instance, after the flip head 308 retrieves the electrical component and is inverted back to the second orientation, an image of the electrical component may be captured by the flip head alignment optic 314 and a position of the electrical component relative to the flip head alignment optic 314 may be determined using the captured image. More specifically, an offset of the center of the electrical component from the center of the flip head alignment optic 314 may be determined using the captured image. The bond head 302 is then moved to a position at which the center of the bond head collet 304 is aligned with the center of the electrical component. This position is based on (i) the alignment position between the center of the flip head collet 310 and the center of the bond head collet 304 determined in step 420 and (ii) the position of the electrical component relative to the flip head alignment optic 314. By repeating these sub-steps on every electrical component, a runtime update of the handover position can be achieved to compensate for the picking errors.

Instead of repeating steps 402 to 420 of method 400 or steps 702 to 710 of method 700 after bonding a predetermined number of electrical components, the bonding apparatus 300 may include a feedback system which receives information (such as the amount of time that has elapsed since the last iteration of these steps or temperature variations of different components of the bonding apparatus 300) and uses this information to decide whether to repeat the steps.

Also, the calibration glass 312 may be replaced by any other transparent body. In fact, the calibration glass 312 may also be replaced by an opaque body or may be removed altogether (in this latter case, the reference marker may be located on a part of the bond head 302). Since the reference marker is not visible from both the upper side and the underside of the body it is located on if the body is opaque, in such cases, the reference marker comprises at least one mark on the upper side of the body and at least one mark on the underside of the body, with these marks aligned along a vertical axis of the body.

Further, the reference marker need not be located at the center of the calibration glass 312. In addition, regardless whether the reference marker is located at the center of the calibration glass 312, methods 400, 700 can be modified accordingly to align points, other than the centers, of different components of the bonding apparatus 300. Similarly, instead of using the centers of the flip head alignment optic 314, the uplook camera 316 and the bond optic 602 as reference points when calculating the parameters in steps 410, 420 and 710, other reference points on these imaging devices may be used as well.

The invention claimed is:

1. A bonding apparatus comprising:
    a movable bond head collet;
    a reference marker fixedly connected to the bond head collet and configured to move with the bond head collet;
    a flip head collet configured to retrieve an electrical component and to transfer the electrical component to the bond head collet;
    a first imaging device configured to capture one or more images of the reference marker and the flip head collet when the flip head collet is not carrying the electrical component;
    a second imaging device configured to capture one or more images of the reference marker and the bond head collet when the bond head collet is not carrying the electrical component; and
    an adjusting mechanism operative to align a position of the bond head collet with a position of the flip head collet based on an offset that is determined from the images of the flip head collet, bond head collet and reference marker.

2. The apparatus according to claim 1, wherein the first and second imaging devices are directed in opposite directions.

3. The apparatus according to claim 1, wherein the first imaging device is located at a relatively fixed position over the flip head collet.

4. The apparatus according to claim 1, wherein the reference marker is movable between a position where it is viewable by the first imaging device and another position where it is viewable by the second imaging device.

5. The apparatus according to claim 1, wherein the reference marker is located on a transparent body.

6. The apparatus according to claim 5, wherein the transparent body comprises glass.

7. The apparatus according to claim 1, wherein the offset is determined using:
- a distance between the bond head collet and the reference marker as obtained from the one or more images of the bond head collet and the reference marker captured by the second imaging device; and
- positions of the reference marker and the flip head collet relative to the first imaging device as obtained from the one or more images of the reference marker and the flip head collet captured by the first imaging device.

8. A bonding apparatus according to claim 1, further comprising:
- a third imaging device configured to capture one or more images of the reference marker and a bonding position at which the bond head collet is operative to bond an electrical component;
- wherein the or another adjusting mechanism is operative to align a position of the bond head collet with a position of the bonding position based on an offset that is determined from the images of the bonding position, bond head collet and reference marker.

9. A method for aligning a position of a movable bond head collet with a position of a flip head collet configured to retrieve an electrical component and to transfer the electrical component to the bond head collet, the method comprising the steps of:
- capturing one or more images of the flip head collet and a reference marker fixedly connected to the bond head collet and configured to move with the bond head collet using a first imaging device when the flip head collet is not carrying the electrical component, said reference marker being fixedly connected to the bond head collet;
- capturing one or more images of the bond head collet and the reference marker using a second imaging device when the bond head collet is not carrying the electrical component;
- determining an offset between the flip head collet and the bond head collet using the images of the flip head collet, bond head collet and reference marker; and
- adjusting the bond head collet relative to the flip head collet to align the positions of the bond head collet and the flip head collet based on the determined offset.

10. The method according to claim 9, wherein the first and second imaging devices are directed in opposite directions.

11. The method according to claim 9, wherein the first imaging device is located at a relatively fixed position over the flip head collet.

12. The method according to claim 9, wherein the step of capturing one or more images of the reference marker using the second imaging device further comprises the step of moving the reference marker from a position where it is viewable by the first imaging device to another position where it is viewable by the second imaging device.

13. The method according to claim 9, wherein the reference marker is located on a transparent body.

14. The method according to claim 13, wherein the transparent body comprises glass.

15. The method according to claim 9, wherein the offset is determined using:
- a distance between the bond head collet and the reference marker as obtained from the one or more images of the bond head collet and the reference marker captured by the second imaging device; and
- positions of the reference marker and the flip head collet relative to the first imaging device as obtained from the one or more images of the reference marker and the flip head collet captured by the first imaging device.

* * * * *